(12) United States Patent
Chang et al.

(10) Patent No.: US 7,543,960 B2
(45) Date of Patent: Jun. 9, 2009

(54) LIGHT-EMITTING DIODE ASSEMBLY

(75) Inventors: Chang-Shen Chang, Taipei Hsien (TW);
Juei-Khai Liu, Taipei Hsien (TW);
Chao-Hao Wang, Taipei Hsien (TW);
Hsien-Sheng Pei, Taipei Hsien (TW)

(73) Assignee: Foxconn Technology Co., Ltd.,
Tu-Cheng, Taipei Hsien (TW)

( * ) Notice: Subject to any disclaimer, the term of this patent is extended or adjusted under 35 U.S.C. 154(b) by 57 days.

(21) Appl. No.: 11/627,601

(22) Filed: Jan. 26, 2007

(65) Prior Publication Data

US 2008/0144319 A1   Jun. 19, 2008

(30) Foreign Application Priority Data

Dec. 15, 2006   (CN) .......................... 2006 1 0157531

(51) Int. Cl.
*F21V 29/00* (2006.01)
(52) U.S. Cl. ...................................... 362/294; 362/373
(58) Field of Classification Search ................. 362/294, 362/373; 361/701; 257/712
See application file for complete search history.

(56) References Cited

U.S. PATENT DOCUMENTS

| | | | | |
|---|---|---|---|---|
| 6,045,240 A | * | 4/2000 | Hochstein | .................. 362/294 |
| 7,095,110 B2 | * | 8/2006 | Arik et al. | .................... 257/712 |
| 7,369,410 B2 | * | 5/2008 | Chen et al. | ................... 361/701 |
| 2005/0167647 A1 | * | 8/2005 | Huang et al. | .................. 257/14 |
| 2006/0055074 A1 | * | 3/2006 | Huang et al. | ................ 264/134 |
| 2007/0086196 A1 | * | 4/2007 | Wong | ......................... 362/294 |
| 2007/0177354 A1 | * | 8/2007 | Hsiao | ......................... 361/701 |
| 2007/0279909 A1 | * | 12/2007 | Li | .............................. 362/294 |
| 2008/0007954 A1 | * | 1/2008 | Li | .............................. 362/294 |

FOREIGN PATENT DOCUMENTS

CN    1676568 A    10/2005

* cited by examiner

*Primary Examiner*—Sandra L O'Shea
*Assistant Examiner*—James W Cranson
(74) *Attorney, Agent, or Firm*—Frank R. Niranjan

(57) ABSTRACT

A light-emitting diode (LED) assembly includes a circuit board (10), at least one LED (20) being electrically connected with and being arranged on a side of the circuit board, and a heat dissipation apparatus (40) being arranged on an opposite side of the circuit board. The circuit board defines at least one through hole (102) corresponding to a position of the at least one LED. Thermal interface material (140) is filled in the at least one hole of the circuit board to thermally interconnect the at least one LED and the heat dissipation apparatus. The thermal interface material is a composition of nano-material and macromolecular material.

17 Claims, 7 Drawing Sheets

LIGHT-EMITTING DIODE ASSEMBLY

BACKGROUND OF THE INVENTION

1. Field of the Invention

The present invention relates generally to light-emitting diode (LED) assemblies, and more particularly to an LED assembly with improved heat dissipation ability so that heat generated by the LEDs of the assembly can be effectively removed.

2. Description of Related Art

Light-emitting diode (LED) is a highly efficient light source currently used widely in such field as automobile, screen display, and traffic light indication. When the LED operates to give off light, heat is accordingly produced.

Generally an LED assembly includes an LED array which has a plurality of LEDs being mounted on and electronically connected with a printed circuit board (PCB). A heat sink made of metal, such as aluminum or copper, is arranged under the PCB to remove the heat generated by the LED. A thermal interface material, such as thermal grease, is preferred for being applied to the contact surfaces between the heat sink and the PCB, or between the PCB and the LED to eliminate the air interstice to thereby improve heat transfer efficiency therebetween. However, the thermal grease has a heat transfer coefficient generally not larger than 5 W/(m·K), which is much smaller than that of metal. The heat generated by the LEDs is difficulty transferred to the heat sink through the thermal grease. The heat of the LED is thus can not be rapidly and efficiently removed, which finally significantly reduces the lifespan of the LEDs.

Therefore, it is desirable to provide an LED assembly wherein one or more of the foregoing disadvantages may be overcome or at least alleviated.

SUMMARY OF THE INVENTION

The present invention relates to a light-emitting diode (LED) assembly. The LED assembly includes a circuit board, at least one LED being electrically connected with and being arranged on a side of the circuit board, and a heat dissipation apparatus being arranged on an opposite side of the circuit board. The circuit board defines at least one through hole corresponding to a position of the at least one LED. Thermal interface material is filled in the at least one hole of the circuit board to thermally interconnect the at least one LED and the heat dissipation apparatus. The thermal interface material is a compound of nano-material and macromolecular material, and has a relatively smaller heat resistance to improve heat transfer efficiency between the LED and the heat sink.

Other advantages and novel features of the present invention will become more apparent from the following detailed description of preferred embodiment when taken in conjunction with the accompanying drawings, in which:

BRIEF DESCRIPTION OF THE DRAWINGS

Many aspects of the present light-emitting diode (LED) assembly can be better understood with reference to the following drawings. The components in the drawings are not necessarily drawn to scale, the emphasis instead being placed upon clearly illustrating the principles of the present LED assembly. Moreover, in the drawings, like reference numerals designate corresponding parts throughout the several views.

DETAILED DESCRIPTION OF THE INVENTION

Figure 1:
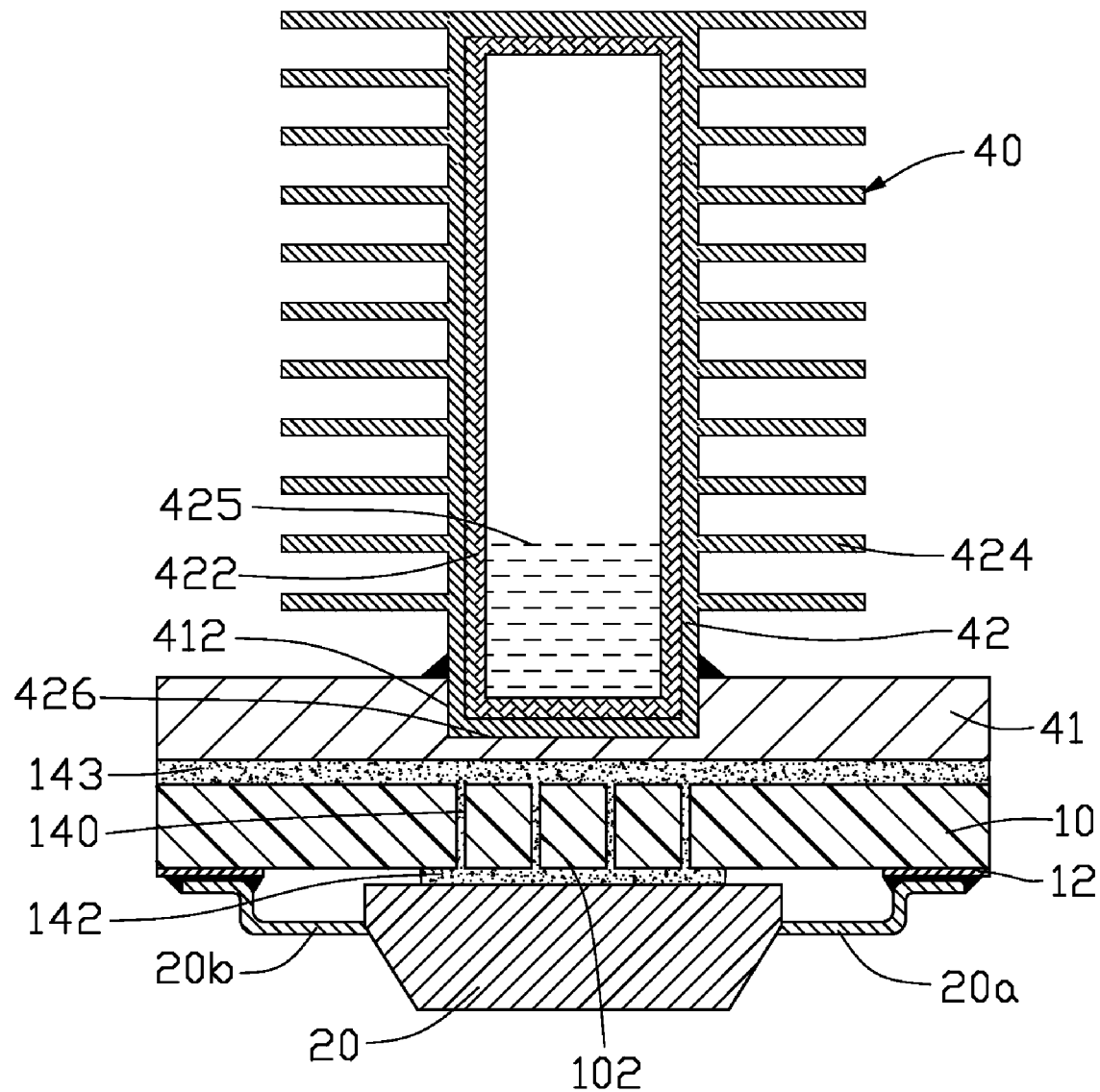
FIG. 1 is a cross-sectional view of an LED assembly in accordance with a first embodiment of the present invention taken along an axial direction thereof.

FIG. 1 illustrates a light-emitting diode (LED) assembly in accordance with a first embodiment of the present invention. The LED assembly includes a circuit board 10, an LED 20 arranged on a lower side of the circuit board 10, and a heat dissipation apparatus 40 arranged on an upper side of the circuit board 10.

The circuit board 10 is planar and thin. A circuitry 12 is formed on the lower surface of the circuit board 10. The LED 20 is attached to the lower surface and is electrically connected with the circuitry 12 of the circuit board 10 through wire bonding, in which a pair of gold threads 20a, 20b of the LED 20 is electrically connected with the circuitry 12. Several through holes 102 are defined in the circuit board 10 corresponding to a position of the LED 20. In this embodiment, there are four through holes 102. Alternatively, the number of the through holes 102 can be changed according to a size or a shape of the LED 20 or an amount of heat which will be generated by the LED 20. Each through hole 102 is filled with thermal interface material 140 which has a relatively higher thermal conductivity coefficient than the conventional thermal grease. The thermal interface material 140 is a composition of nano-material and macromolecular. The macromolecular is one of paraffin and polypropylene. The nano-material can be nano-particles or carbon nanotubes. Since nano-material have a very small size with a diameter ranging from 1~100 nm, a surface area of the nano-material is much larger than that of the same material which has the same volume. Thus a heat transfer area of the nano-material is much enlarged, which, in result, improves heat transfer efficiency of the thermal interface material 140 which adopts the nano-material. For example, the carbon nanotubes has a heat transfer coefficient about 3000-6600 W/(m·k), which is hundreds times more than that of the conventional thermal grease. The thermal interface material 140 adopting the carbon nanotubes thus can have a much larger heat transfer coefficient.

One kind of such a thermal interface material 140 can be obtained by a combination of carbon nanotubes, paraffin, and Dimethyl Formamide (DMF, $C_3H_7NO$). A process for obtaining the thermal interface material 140 is preformed by firstly providing the three materials with a ratio in volume of being about 100:3:100 (carbon nanotubes:paraffin:DMF), and then heating the three materials to 70-80° C. The three materials are then mixed together in a ball mill. The carbon nanotubes are thus evenly distributed in the melted paraffin. The mixture is then dried and cooled to form the thermal interface material 140. Also other methods can be used to form the thermal interface material 140. For example, firstly aligned carbon nanotube arrays are synthesized in a hot filament plasma enhanced chemical vapor deposition (HF-PECVD) system. A substrate (metal, glass, silicon, etc.) is coated with nickel nano-particles and then introduced to the CVD chamber. Then the aligned carbon nanotube arrays are mixed with melted paraffin by firstly vacuuming the aligned carbon nanotube arrays to remove air therein, and then filling the melted paraffin in the aligned carbon nanotube arrays. Finally the aligned carbon nanotube arrays with melted paraffin filled are cooled to form the thermal interface material 140. Details regarding the method of manufacturing the carbon nanotubes for forming the thermal interface material 140 of the present invention can be referred to U.S. patent application Ser. No. 11/025,160, filed on Apr. 21, 2005, entitled "METHOD FOR MANUFACTURING CARBON NANOTUBES WITH UNIFORM LENGTH", and assigned to Tsinghua University, Beijing City, China and Hon Hai Precision Industry Co. Ltd., Tu-cheng City, Taiwan, which is now published as U.S. patent publication No. 20060055074A1. Details regarding the method of forming the thermal interface material 140 employing the carbon nanotubes can be referred to U.S. patent application Ser. No. 11/024,513, filed on Dec. 29, 2004, entitled "THERMAL INTERFACE MATERIAL AND METHOD FOR MANUFACTURING SAME", and assigned to Tsinghua University, Beijing City, China and Hon Hai Precision Industry Co. Ltd., Tu-cheng City, Taiwan, which is now published as U.S. patent publication No. 20050167647A1. The two patent publications disclose preferred methods for forming the carbon nanotubes and the thermal interface material 140 incorporating such carbon nanotubes; however, the thermal interface material 140 for use in the present invention is not limited to the two patent publications. All thermal interface materials having nano-material including carbon nanotubes or nano-particles fall within the scope of the present invention.

Thermal interface material 143 having a same composition as the thermal interface material 140 is applied to the contact surfaces between the heat dissipation apparatus 40 and the circuit board 10 to eliminate an air interface therebetween, and thermal interface material 142 having the same composition is applied between the circuit board 10 and the LED 20 to eliminate an air interstice therebetween. Thus the LED 20 and the heat dissipation apparatus 40 are thermally connected together through the thermal interface material 142 applied between the LED 20 and the circuit board 10, the thermal interface material 140 filled in the through holes 102 of the circuit board 10, and the thermal interface material 143 applied between the circuit board 10 and the heat dissipation apparatus 40. As the thermal interface materials 142, 140, 143 have a much larger heat transfer capability, the heat generated by the LED 20 is easily and timely transferred to the heat dissipation apparatus 40.

The heat dissipation apparatus 40 includes a base 41 and a heat pipe 42. The base 41 is made of aluminum. A bottom surface of the base 41 is thermally attached to the upper surface of the circuit board 10 with the thermal interface material 143 applied therebetween to thereby improve heat transfer efficiency. A notch 412 is defined in a top surface of the base 41 corresponding to the position of the LED 20. The heat pipe 42 is column-shaped, and includes a hollow and vacuumed pipe body (not labeled) containing working fluid 425, such as water, alcohol therein. Against an inner surface of the pipe body is a wick structure 422, which is configured of sintered power or screen mesh. The heat pipe 42 is made of aluminum through extrusion. One end of the heat pipe 42 contacting with the base 41 forms an evaporating section, and the other remote end forms a condensing section. The evaporating section of the heat pipe 42 forms a planar-shaped bottom surface 426 which is perpendicular to an axial direction of the heat pipe 42. When assembled, the heat pipe 42 is fixedly assembled with the base 41 through soldering. The evaporating section of the heat pipe 42 is received in the notch 412 of the base 41 with the bottom surface 426 facing to the LED 20. A plurality of fins 424 are integrally formed with and surround the heat pipe 42 as a monolith piece. Each fin 424 is ring shaped, and extends radially and outwardly from an outer surface of the heat pipe 42.

During operation, as the heat generated by the LED 20 is transferred through the thermal interface materials 142, 140, 143 to the base 41, and then to the heat pipe 42, the working fluid 425 contained in the heat pipe 42 absorbs the heat and evaporates into vapor which carries the heat then runs quickly to be full of an interior of the heat pipe 42. Whenever the vapor comes into contact with condensing section of the heat pipe 42 which has the fins 424 extending thereat, it releases the heat to the fins 424 to dissipate the heat to ambient air. After the heat is released, the vapor condenses into liquid, which is then brought back by the wick structure 422 to the evaporating section of the heat pipe 42. Since the thermal interface materials 142, 140, 143 each are a compound of nano-material and macromolecular, a heat transfer efficiency of the thermal interface materials 142, 140, 143 is highly enhanced. Thus, the heat of the LED 20 can be rapidly and efficiently transferred to the heat dissipation apparatus through the thermal interface materials 142, 140, 143. Furthermore, as the heat pipe 42 transfers the heat employing a phase change mechanism of the working fluid 425, the heat transferred to the heat pipe 42 from the LED 20 is thus rapidly and evenly distributed over the entire heat pipe 42 and then is further conveyed to the fins 424 through which the heat is dissipated into ambient air. Accordingly, the heat of the LED 20 is timely dissipated to ambient air, which significantly improves the lifespan of the LED 20.

Figure 2:
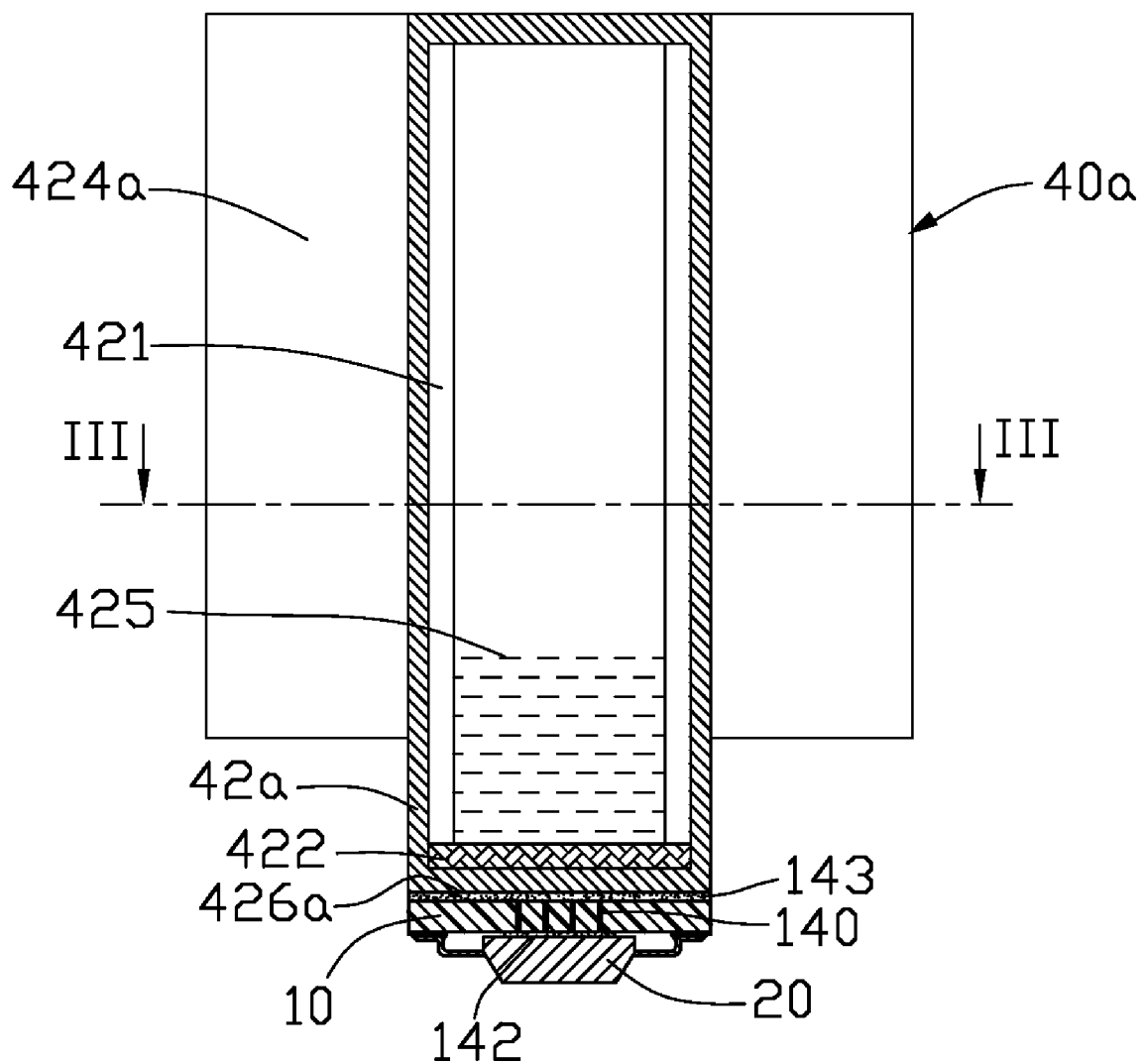
FIG. 2 is similar to FIG. 1, but shows the LED assembly in accordance with a second embodiment of the present invention.
Figure 3:
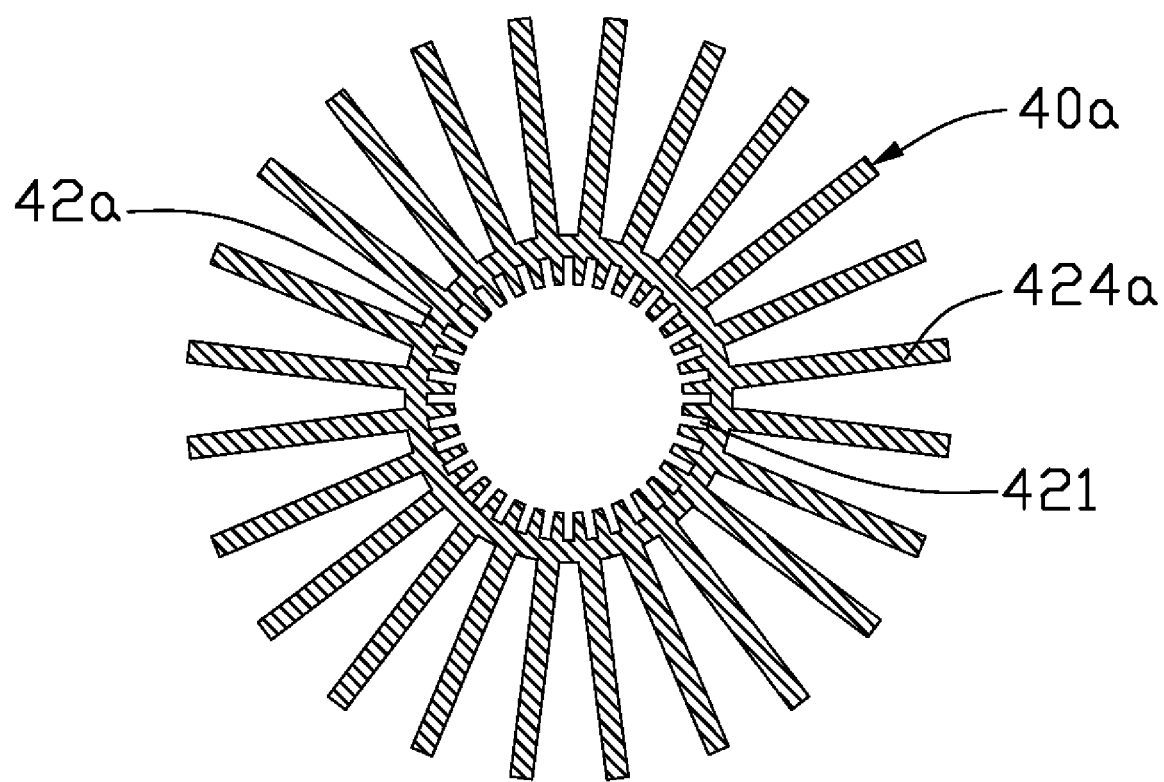
FIG. 3 is a cross-sectional view of the LED assembly of FIG. 2 taken along line III-III thereof.

FIGS. 2-3 show a second embodiment of the LED assembly which has a heat dissipation apparatus 40a also adopting a heat pipe 42a to transfer the heat of the LED 20. The difference between the second embodiment and the first embodiment is that the base 41 of the heat dissipation apparatus 40 of the first embodiment is omitted in the second embodiment. The bottom surface 426a of the evaporating section of the heat pipe 42a is attached to the upper surface of the circuit board 10. Also the bottom surface 426a of the heat pipe 42a faces to the LED 20, and the thermal interface material 143 is applied to the contact surfaces between the bottom surface 426a and the circuit board 10. The circuit board 10 defines the through holes 102 corresponding to the bottom surface 426a of the heat pipe 42a. Also the thermal interface materials 140, 142 are filled in the through holes 102 and applied between the circuit board 10 and the LED 20 arranged on the circuit board 10.

The heat pipe 42a has a wick structure 422 being located in and abutting against the pipe body on an opposite side of the bottom surface. The heat pipe 42a defines a plurality of superfine grooves 421 in the inner surface thereof. The superfine grooves 421 extend along the axial direction of the heat pipe 42a. The superfine grooves 421 act as the wick structure 422, both acting to generate capillary force to bring back condensed working fluid 425 from the condensing section to the evaporating section. The fins 424a are integrally formed with and extend from the outer surface of the heat pipe 42a. Each fin 424a is flat and thin. The fins 424a extend along the axial direction of the heat pipe 42a, and are evenly spaced from each other along a circumferential direction of the heat pipe 42a. During operation, the heat generated by the LED 20 can be directly transferred to the heat pipe 42a through the thermal interface materials 142, 140, 143, which have high heat transfer capability and then to the fins 424a to dissipate to ambient air. Heat resistance between the base 41 and the heat pipe 42 of the first embodiment is avoided in this second embodiment.

Figure 4:
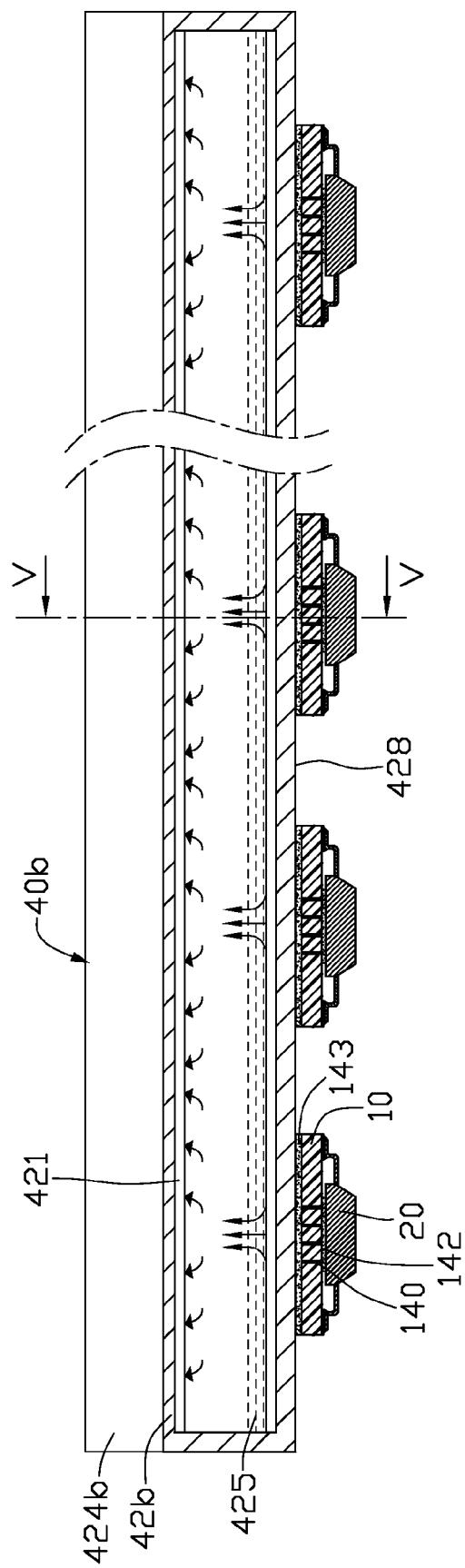
FIG. 4 is similar to FIG. 1, shows the LED assembly in accordance with a third embodiment of the present invention.
Figure 5:
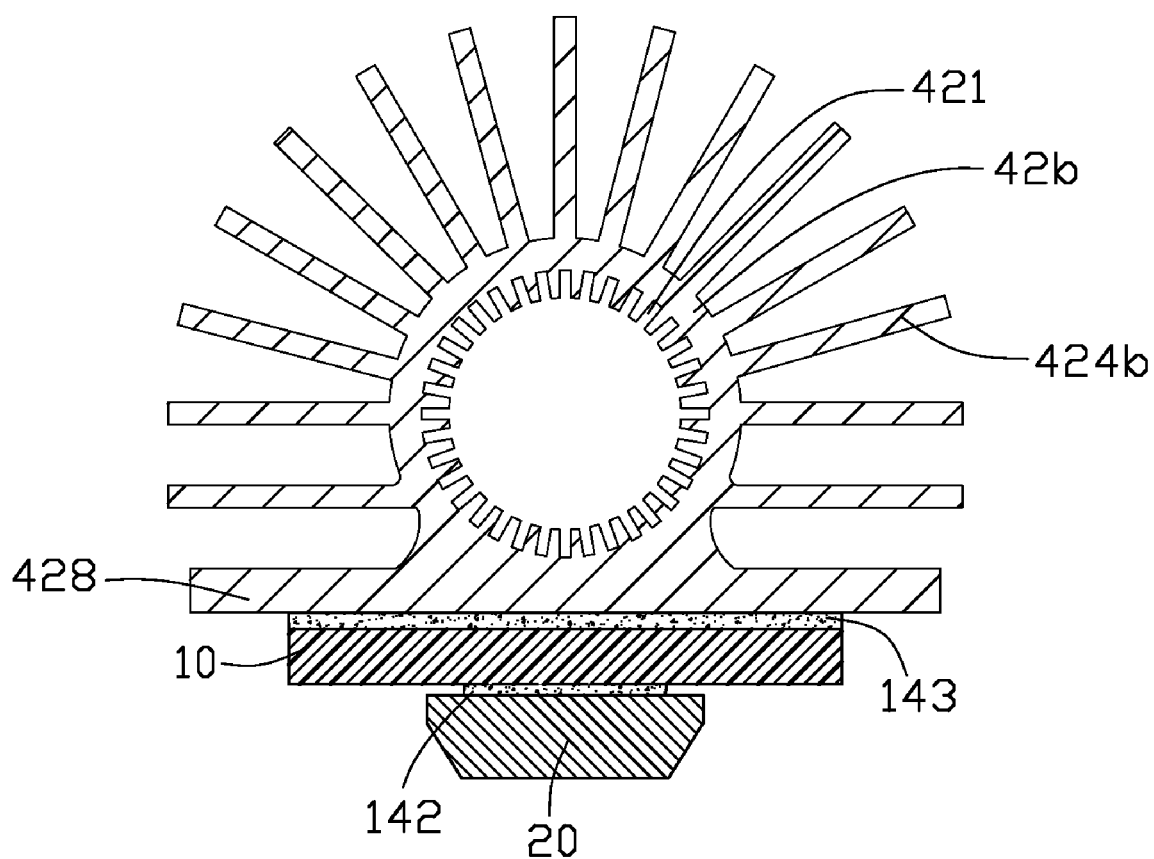
FIG. 5 is a cross-sectional view of the LED assembly of FIG. 4 taken along line V-V thereof.

FIGS. 4-5 show a third embodiment of the LED assembly. In this embodiment, the heat pipe 42b of the heat dissipation apparatus 40b is a plate-type heat pipe, and has an elongated, substantially rectangular shape. The bottom surface 428 parallel to the axial direction of the heat pipe 42 is planar-shaped and is thermally attached to the circuit board 10 with the thermally interface material 143 applied therebetween. Since the bottom surface 428 has a much larger area, more LEDs 20 can be mounted on the heat pipe 42b. In this embodiment, there are four LEDs 20 mounted on the heat pipe 42b. Each LED 20 is attached the circuit board 10 thermally and mechanically. The circuit board 10 defines the four through holes 102 corresponding to each LED 20. Also the thermal interface materials 140, 142 are filled in the through holes 102 and applied to the contact surfaces between the LEDs 20 and the circuit board 10, and between the circuit board 10 and the heat pipe 42. The other portion of the outer surface of the heat pipe 42b is arc-shaped. A plurality of grooves 421 are defined in the heat pipe 42b, and a plurality of fins 424b are integrally formed with and extend from the other portion of the outer surface of the heat pipe 42b. Each fin 424b is flat and thin. The fins 424b extend along the axial direction of the heat pipe 42b, and are evenly spaced from each other along a circumferential direction of the heat pipe 42b. The heat of the LEDs 20 can be transferred to the heat pipe 42b synchronously and then to the fins 424b to dissipate to ambient air.

Figure 6:
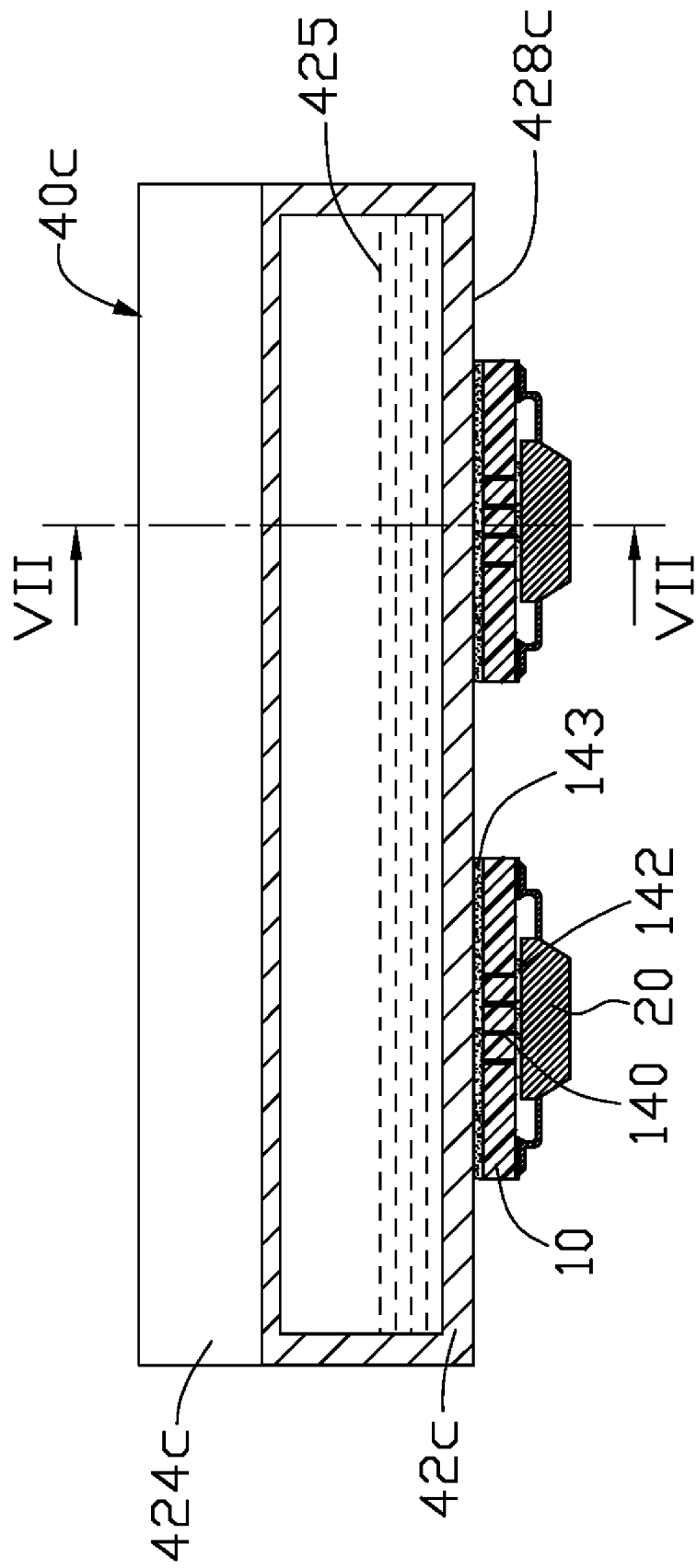
FIG. 6 is a cross-sectional view of the LED assembly in accordance with a fourth embodiment of the present invention.
Figure 7:
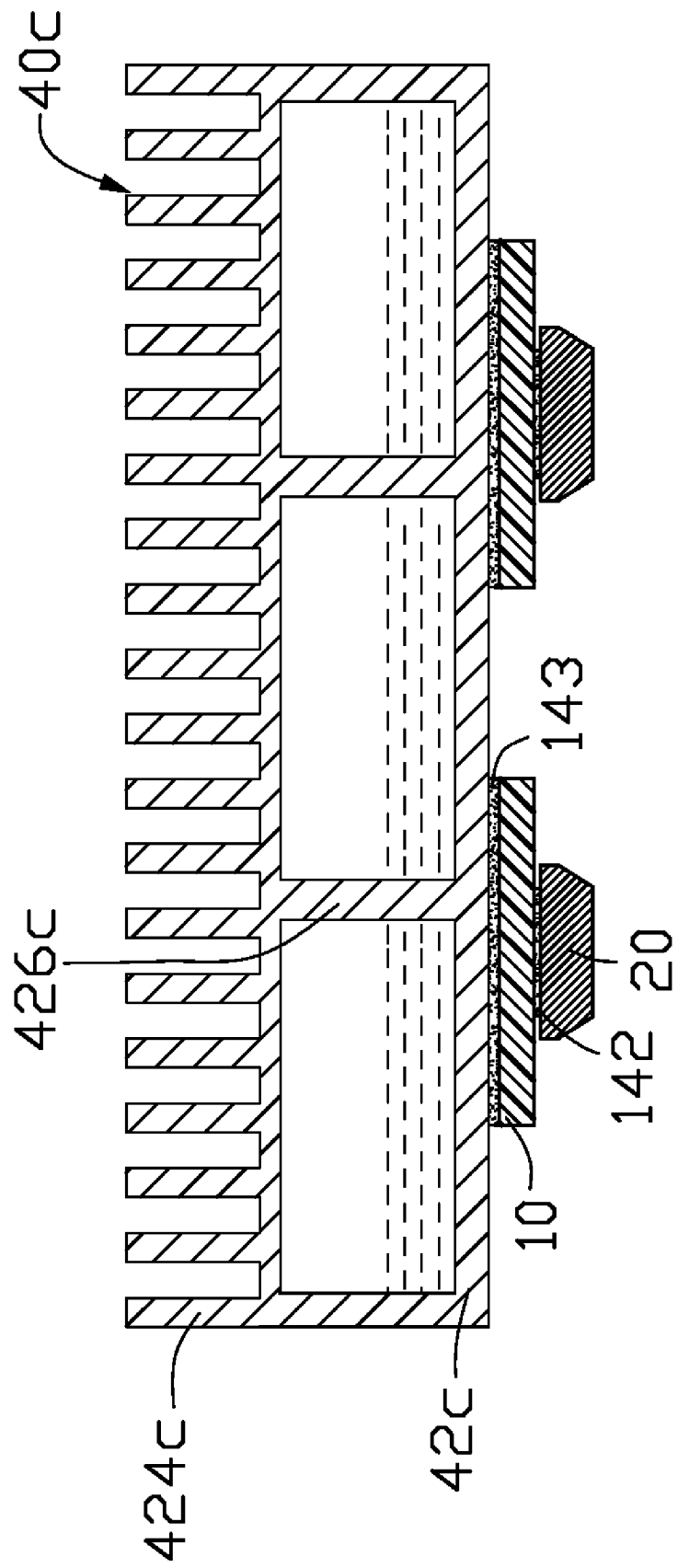
FIG. 7 is a cross-sectional view of the LED assembly of FIG. 6 taken along line VII-VII thereof.

FIGS. 6-7 illustrate a fourth embodiment of the present LED assembly, in which a vapor chamber 42c is provided. The vapor chamber 42c has a much larger size than the heat pipe 42, 42a, 42b shown in the previous embodiments. The vapor chamber 42c has a top surface from which a plurality of fins 424c extend upwardly and a flat bottom surface 428c thermally attached to the circuit board 10. The LEDs 20 are electrically connected with and are maintained in thermal and physical contact with the circuit board 10. The circuit board 10 defines the four through holes 102 corresponding to each LED 20. Also the thermal interface material 140, 142, 143 are filled in the through holes 102, and applied to the contact surfaces between the LEDs 20 and the circuit board 10, and between the circuit board 10 and the bottom surface 428c of the vapor chamber 42c. The vapor chamber 42c also contains a working fluid 425 therein and also employs a phase change mechanism to transfer heat. A plurality of heat transfer enhancing structures 426c is arranged between the top surface and the bottom surface 428c of the vapor chamber 42c. The heat transfer enhancing structures 426c are capable of transferring heat from the bottom surface 428c to the top surface as the working fluid 425 to thereby overcome the heat transfer threshold of the working fluid 425 if it is not able to timely evaporate during the initial phase of heat transfer from the bottom surface 428c to the top surface of the vapor chamber 42c. The heat from the LEDs 20 is directly transferred to the vapor chamber 42c through the thermal interface materials 140, 142, 143 the and then is transferred from the vapor chamber 42c to the fins 424c for dissipation. As the vapor chamber 42c has a much larger size, more LEDs 20 can be provided to the LED assembly so as to increase the overall lighting brightness. In this embodiment, there are two LED arrays being mounted on the vapor chamber 42c for heat dissipation.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A light-emitting diode (LED) assembly, comprising:
a circuit board defining at least one through hole therein;
at least one LED having a pair of threads extending outwardly from the at least one LED, the threads being electrically connected with the circuit board, and the at least one LED being arranged on a first side of the circuit board and confronting one end of the least one hole of the circuit board;
a heat dissipation apparatus being arranged on a second side of the circuit board opposite to the first side of the circuit board and confronting an opposite end of the at least one hole; and
thermal interface material filled in the at least one hole of the circuit board with one end at the first side of the circuit board attaching to the at least one LED directly and an opposite end at the second side of the circuit board attaching to the heat dissipation apparatus directly for conducting heat of the at least one LED to the heat dissipation apparatus directly, the thermal interface material comprising a composition of nano-material and macromolecular material.

2. The assembly of claim 1, wherein the thermal interface material further is applied to entire contact surfaces defined either between the heat dissipation apparatus and the circuit board, or between the circuit board and the at least one LED.

3. The assembly of claim 2, wherein the heat dissipation apparatus comprises a plate-type heat pipe, a bottom surface of the heat pipe being elongated and planar, the bottom surface of the heat pipe and the second side of the circuit board constructing the contact surfaces of the heat dissipation apparatus and the circuit board, the at least one LED comprising a plurality of LEDs arranged on the circuit board, the bottom surface of the heat pipe being parallel to an axis of the heat pipe.

4. The assembly of claim 3, wherein other portion of an outer surface of the heat pipe, except the bottom surface, is arc-shaped, a plurality of fins extending integrally and radially from the other portion of the outer surface of the heat pipe, each fin being flat and extending along the axis of the heat pipe.

5. The assembly of claim 2, wherein the heat dissipation apparatus comprises a flat base and a column-shaped heat pipe located over the at least one hole of the circuit board, a bottom surface of the base and the second side of the circuit board constructing the contact surfaces of the heat dissipation apparatus and the circuit board, a concave depressed from a top surface of the base, the heat pipe having an evaporating section engaging into the concave and a condensing end extending upwardly from the evaporating section of the heat pipe.

6. The assembly of claim 5, wherein the heat pipe is an extruded aluminum heat pipe with a plurality of fins extending integrally and outwardly from the heat pipe as a monolithic piece, each fin being perpendicular to an axis of the heat pipe.

7. The assembly of claim 2, wherein the heat dissipation apparatus comprises an extruded aluminum heat pipe having an evaporating section and a condensing section formed at two opposite ends, respectively, and a plurality of fins are integrally formed with and extend outwardly from the condensing section of the heat pipe as a monolithic piece, an end surface of the heat pipe at the evaporation section and the second side of the circuit board constructing the contact surfaces of the heat dissipation apparatus and the circuit board.

8. The assembly of claim 7, wherein a plurality of superfine grooves are integrally formed in an inner surface of the heat pipe.

9. The assembly of claim 2, wherein the heat dissipation apparatus comprises a vapor chamber having a flat bottom surface, the bottom surface of the vapor chamber and the second side of the circuit board constructing the contact surfaces of the heat dissipation apparatus and the circuit board.

10. The assembly of claim 9, wherein the vapor chamber has a plurality of fins integrally extending upwardly from a top surface of the vapor chamber, and a heat transfer enhancing structure interconnecting the bottom surface of the vapor chamber with the top surface of the vapor chamber.

11. The assembly of claim 1, wherein the nano-material is one of carbon nanotubes and nano-particles.

12. A light-emitting diode (LED) assembly, comprising:
a circuit board defining at least one through hole therein;
at least one LED having a pair of threads extending outwardly from the at least one LED, the threads being electrically connected with the circuit board, and the at least one LED being arranged on a bottom side of the circuit board and confronting a bottom end of the least one hole of the circuit board;
a heat dissipation apparatus being arranged on a top side of the circuit board and located over the at least one through hole of the circuit board, the heat dissipation apparatus comprising a hollow body in which a working fluid is provided to generate phase change during operation of the LED assembly; and
thermal interface material filled in the at least one hole of the circuit board with a top end at the top side of the circuit board attaching to the at least one LED directly and a bottom end at the bottom side of the circuit board attaching to the heat dissipation apparatus directly for conducting heat of the at least one LED to the heat dissipation apparatus directly, the thermal interface material comprising a compound of nano-material and macromolecular.

13. The assembly of claim 12, wherein the thermal interface material is further applied to entire contact surfaces defined either between the heat dissipation apparatus and the circuit board, or between the circuit board and the at least one LED.

14. The assembly of claim 12, wherein the heat dissipation apparatus is one of a heat pipe and a vapor chamber.

15. The assembly of claim 14, wherein the heat dissipation apparatus is made of aluminum through extrusion, and a plurality of fins are integrally formed with and extend outwardly from the heat dissipation apparatus as a monolithic piece.

16. The assembly of claim 12, wherein the nano-material is one of carbon nanotubes and nano-particles.

17. The assembly of claim 12, wherein the macromolecular is one of paraffin and polypropylene.

* * * * *